(12) United States Patent
Sung et al.

(10) Patent No.: US 7,705,530 B2
(45) Date of Patent: Apr. 27, 2010

(54) DISPLAY DEVICE

(75) Inventors: Si-Duk Sung, Seoul (KR); Chun-Seok Ko, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 292 days.

(21) Appl. No.: 11/765,808

(22) Filed: Jun. 20, 2007

(65) Prior Publication Data

US 2008/0010876 A1 Jan. 17, 2008

(30) Foreign Application Priority Data

Jul. 12, 2006 (KR) .................... 10-2006-0065304

(51) Int. Cl.
*H01J 1/62* (2006.01)
(52) U.S. Cl. ...................... 313/504; 313/506
(58) Field of Classification Search ............. 313/498, 313/504–506
See application file for complete search history.

(56) References Cited

U.S. PATENT DOCUMENTS

2004/0004424 A1* 1/2004 Sakurai ............... 313/110

FOREIGN PATENT DOCUMENTS

| JP | 2002-215060 | 7/2002 |
| JP | 2004-234938 | 8/2004 |
| JP | 2005-242248 | 9/2005 |

\* cited by examiner

*Primary Examiner*—Vip Patel
(74) *Attorney, Agent, or Firm*—H.C. Park & Associates, PLC

(57) ABSTRACT

A display device has an insulating substrate with a first surface and a second surface, a display element having an organic light-emitting layer arranged between two electrodes, a flexible member having a first end connected to the first surface and a second end facing the first end and the first surface, and a first accommodating member having a lower surface substantially parallel with the insulating substrate, a lateral surface extending from the lower surface, and a protruding part extending from the lower surface toward the first end. The first accommodating member includes a through hole, and the flexible member extends through the through hole so the second end is positioned outside the first accommodating member. The insulating substrate is arranged in the first accommodating member, and the protruding part may contact and press against the first end connected to the insulating substrate.

21 Claims, 13 Drawing Sheets

DISPLAY DEVICE

CROSS-REFERENCE TO RELATED APPLICATION

This application claims priority from and the benefit of Korean Patent Application No. 10-2006-0065304, filed on Jul. 12, 2006, which is hereby incorporated by reference for all purposes as if fully set forth herein.

BACKGROUND OF THE INVENTION

1. Field of the Invention

The present invention relates to a display device, and more particularly, to a display device in which a flexible member is stably connected to an insulating substrate.

2. Discussion of the Background

Recently, the organic light-emitting diode display (OLED) has become popular as a type of display device. OLEDs are advantageous as display panels because they can be driven by a low voltage, they are light and small, they have a wide viewing angle, and they can respond quickly to driving signals.

Generally, an OLED includes an insulating substrate, a display element formed on the insulating substrate, and a flexible member connected to the insulating substrate. A driving signal, a driving voltage, and a common voltage are supplied to the display element through the flexible member. The flexible member may be connected to a circuit substrate and the display element. The flexible member and the display element are generally arranged to contact the same surface of the insulating substrate. Thus, to decrease the size of the OLED, the flexible member is folded over onto the insulating substrate.

An OLED may be a bottom emission type in which light from the display element is emitted through insulating substrate. When the flexible member is folded in the bottom emission type OLED, the flexible member is bent in a direction toward which light is not emitted. More specifically, the flexible member is bent toward an upper part of the display element. However, when the flexible member is bent toward the upper part of the display element, the flexible member may become disconnected from the insulating substrate. Therefore, a stable assembly is necessary to prevent the flexible member from disconnecting from the insulating substrate.

SUMMARY OF THE INVENTION

The present invention provides a display device in which a flexible member is stably connected to an insulating substrate.

Additional aspects and/or advantages of the present invention will be set forth in part in the description which follows and, in part, will be apparent from the description, or may be learned by practice of the present invention.

The present invention discloses a display device including an insulating substrate comprising a first surface and a second surface opposing the first surface, a display element arranged on the first surface, the display element comprising an organic light-emitting layer arranged between a first electrode and a second electrode, a flexible member connected to the display element, the flexible member comprising a first end connected to the first surface, and a second end facing the first end and the first surface, and a first accommodating member comprising a lower surface arranged substantially parallel with the insulating substrate, a lateral surface extending from the lower surface, and a protruding part extending from the lower surface toward the first end of the flexible member.

The present invention also discloses a display device including an insulating substrate, a display element arranged on one surface of the insulating substrate and comprising an organic light-emitting layer, a flexible member comprising a first end connected to a lateral side of the insulating substrate, a circuit substrate connected to a second end of the flexible member, and an accommodating member accommodating the insulating substrate. Further, the flexible member is bent to allow the circuit substrate to overlap with the display element, and the accommodating member comprises a protruding member to contact the first end.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF EXEMPLARY EMBODIMENTS

Figure 1:
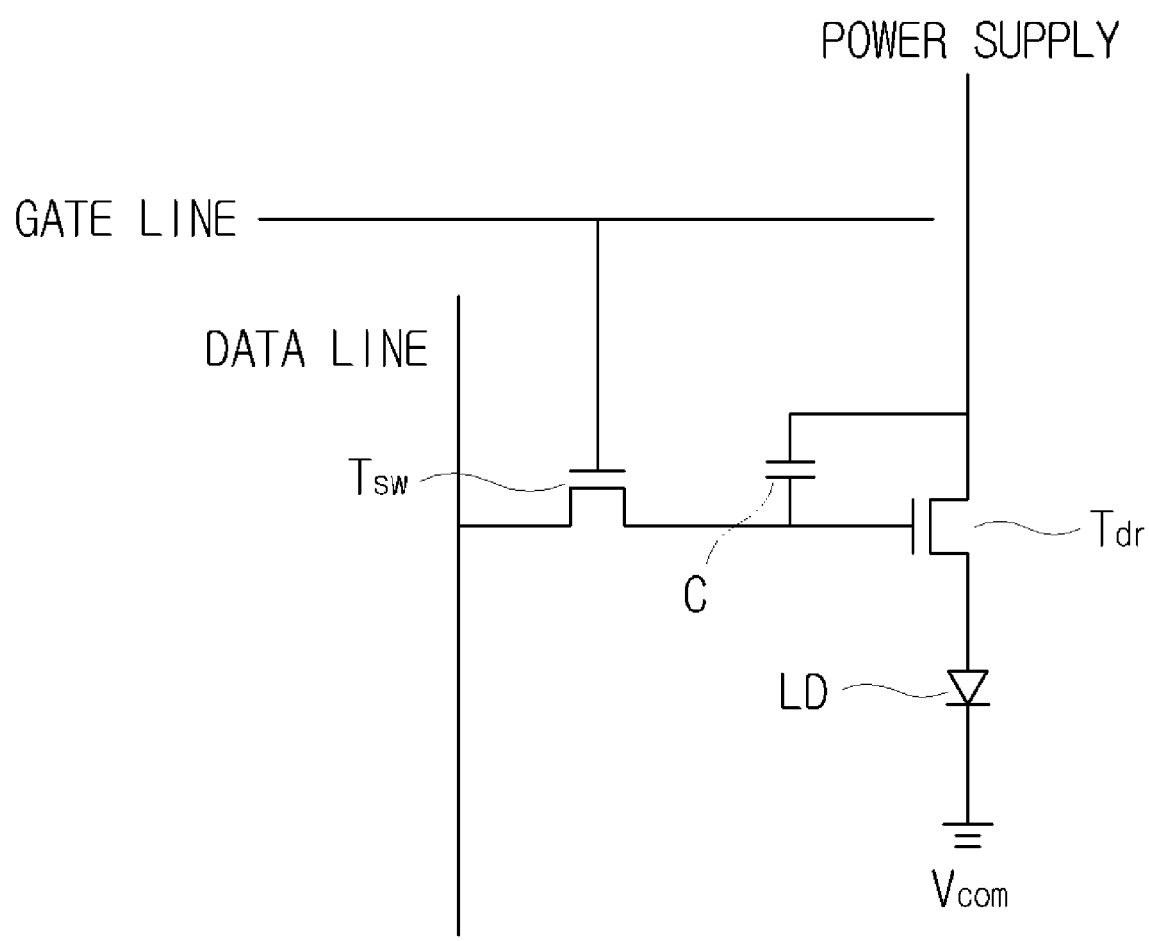
FIG. 1 illustrates an equivalent circuit of a pixel in a display device according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected to, or coupled to the other element or layer, mechanically or electrically, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 illustrates an equivalent circuit of a pixel in a display device according to a first exemplary embodiment of the present invention.

As shown in FIG. 1, a pixel may include signal lines. The signal lines may include a gate line that transmits a scanning signal, a data line that transmits a data signal, and a power supply line that transmits a driving voltage. The data line and the power supply line may be arranged substantially parallel with each other. The gate line may be arranged to extend in a direction substantially perpendicular to the data line and the power supply line.

The pixel also includes an organic light-emitting device LD, a switching thin film transistor (TFT) Tsw, a driving TFT Tdr, and a capacitor C.

The driving TFT Tdr includes a control terminal, an input terminal, and an output terminal. The control terminal is connected to the switching TFT Tsw. The input terminal is connected to the power supply line. The output terminal is connected to the organic light-emitting device LD.

The organic light-emitting device LD may include an anode connected to the output terminal of the driving TFT Tdr, and a cathode connected to a voltage source having a common voltage Vcom. The common voltage Vcom may be a ground voltage. The organic light-emitting device LD may emit light having an intensity corresponding to an output current of the driving TFT Tdr, thereby displaying an image. The output current of the driving TFT Tdr may correspond to a voltage difference between the control terminal and the output terminal of the driving TFT Tdr.

The switching TFT Tsw includes a control terminal, an input terminal, and an output terminal. The control terminal is connected to the gate line, and the input terminal is connected to the data line. The output terminal of the switching TFT Tsw is connected to the control terminal of the driving TFT Tdr. The switching TFT Tsw turns on according to the scanning signal supplied from the gate line, and transmits the data signal supplied through the data line to the driving TFT Tdr.

The capacitor C is connected between the control terminal and the input terminal of the driving TFT Tdr. The capacitor C charges to and stores a voltage difference corresponding to the data signal input to the control terminal of the driving TFT Tdr.

Figure 2:
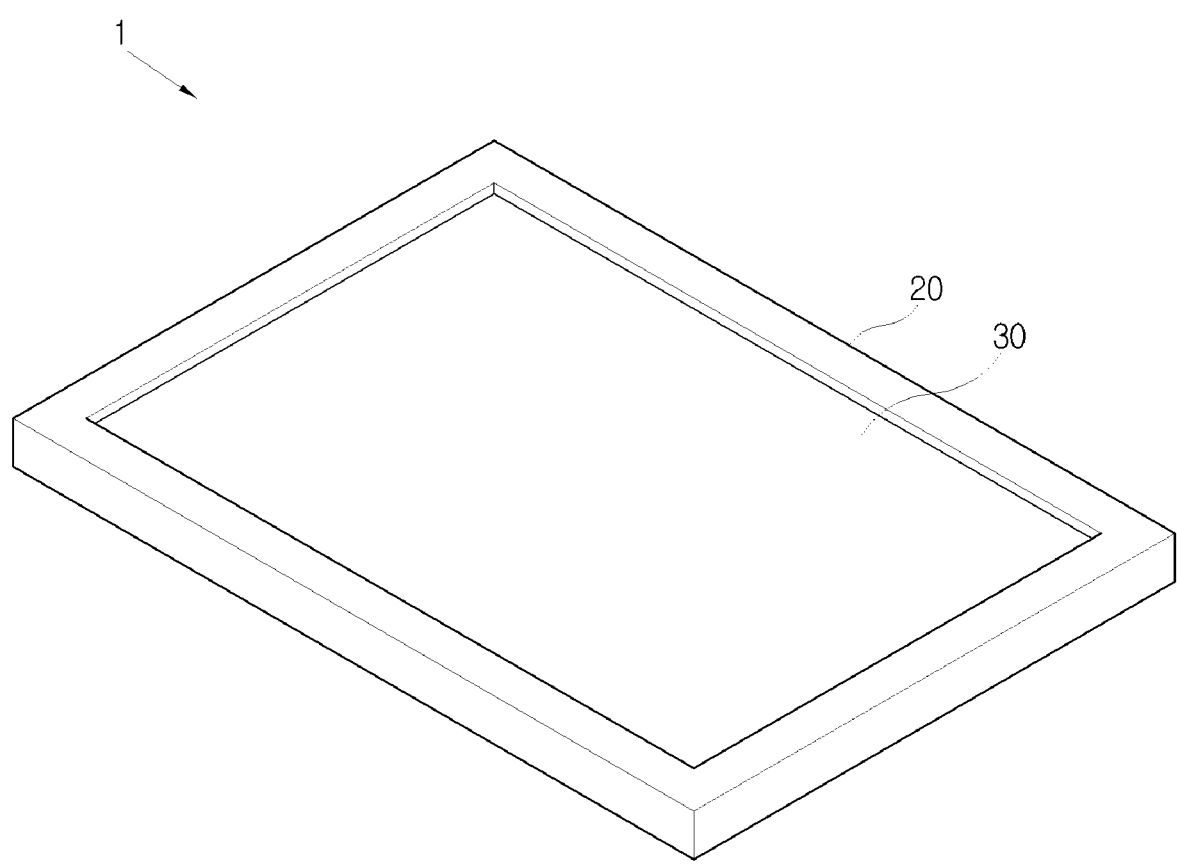
FIG. 2 is a front perspective view of the display device according to the first exemplary embodiment of the present invention.
Figure 3:
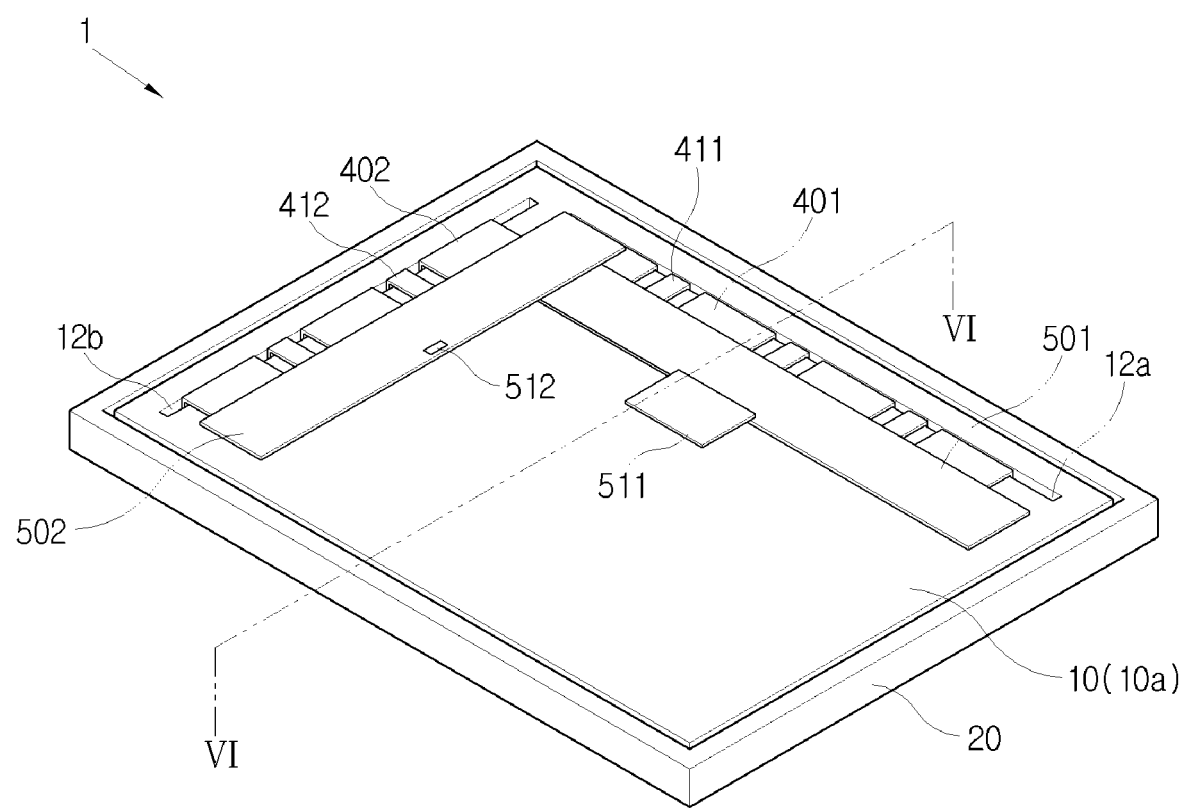
FIG. 3 is a rear perspective view of the display device according to the first exemplary embodiment of the present invention.
Figure 4:
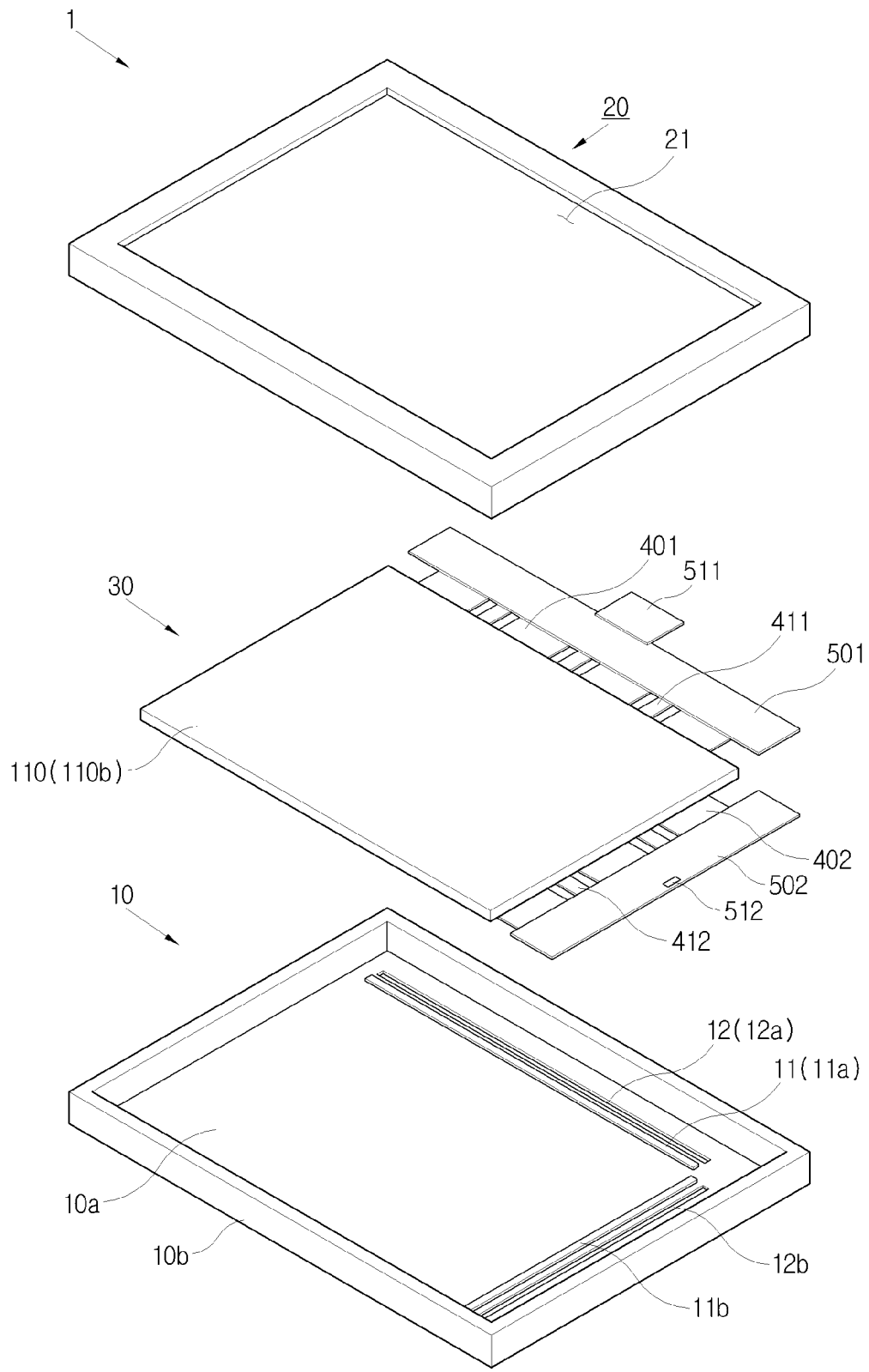
FIG. 4 is an exploded perspective view of the display device according to the first exemplary embodiment of the present invention.

FIG. 2 is a front perspective view of the display device according to the first exemplary embodiment of the present invention. FIG. 3 is a rear perspective view of the display device according to the first exemplary embodiment of the present invention. FIG. 4 is an exploded perspective view of the display device according to the first exemplary embodiment of the present invention.

As shown in FIG. 2, the display device 1 according to the first exemplary embodiment of the present invention includes a panel assembly 30 and a second accommodating member 20. The panel assembly 30 is partially exposed by the second accommodating member 20. An image is formed on the exposed part of the panel assembly 30.

As shown in FIG. 3, a through hole 12a and a through hole 12b are formed in a lower surface 10a of the first accommodating member 10. The through hole 12a may be arranged along a first side of the first accommodating member 10, and a through hole 12b may be arranged along a second side of the first accommodating member 10. A first flexible member 401, a second flexible member 411, a third flexible member 402, and a fourth flexible member 412 of the panel assembly 30 extend outside of the first accommodating member 10 through the through hole 12a and the through hole 12b. The first flexible member 401 and the second flexible member 411 are arranged corresponding to the first side of the first accommodating member 10 through the through hole 12a and connect to a first circuit substrate 501. The third flexible member 402 and the fourth flexible member 412 are arranged corresponding to the second side of the first accommodating member 10 through the through hole 12b and connect to a second circuit substrate 502. The first circuit substrate 501 is connected to an external connector 511. The second circuit substrate 502 is connected to a connector 512.

As shown in FIG. 4, the panel assembly 30 is arranged in a space between the first accommodating member 10 and the second accommodating member 20. The exposed part of the panel assembly 30 includes a first surface 110b of an insulating substrate 110.

The first accommodating member 10 includes the lower surface 10a, which is arranged substantially parallel with the insulating substrate 110 of the panel assembly 30, and a lateral surface 10b which is arranged substantially perpendicular from the lower surface 10a. The lower surface 10a also includes a protruding part 11 and the through hole 12 as described further above.

The protruding part 11 includes a first protruding part 11a arranged along a first side of the lower surface 10a, and a second protruding part 11b arranged along a second side of the lower surface 10a. The first protruding part 11a may extend in a direction substantially perpendicular to the second protruding part 11b. The first protruding part 11a may be longer than the second protruding part 11b. The protruding part 11 according to the first exemplary embodiment of the present invention is formed integrally with the first accommodating member 10. Alternatively, in another exemplary embodiment of the present invention, the protruding part 11 may be a separate element that is connected to the first accommodating member 10.

The first through hole 12a may be arranged substantially parallel with the first protruding part 11a. The second through hole 12b may be arranged substantially parallel with the second protruding part 11b. The first through hole 12a may be arranged substantially perpendicular to the second through hole 12b. The first through hole 12a may be longer than the second through hole 12b.

The second accommodating member 20 may be larger than the first accommodating member 10 such that the lateral surface 10b may be arranged inside the edge portions of the second accommodating member 20 when the display panel 1 is assembled. The second accommodating member 20 includes an opening part 21 through which the panel assembly 30 is exposed for displaying an image when the display panel 1 is assembled.

The first accommodating member 10 and/or the second accommodating member 20 may be formed of a light-weight material, such as plastic, to reduce the weight of the display device 1.

Figure 5:
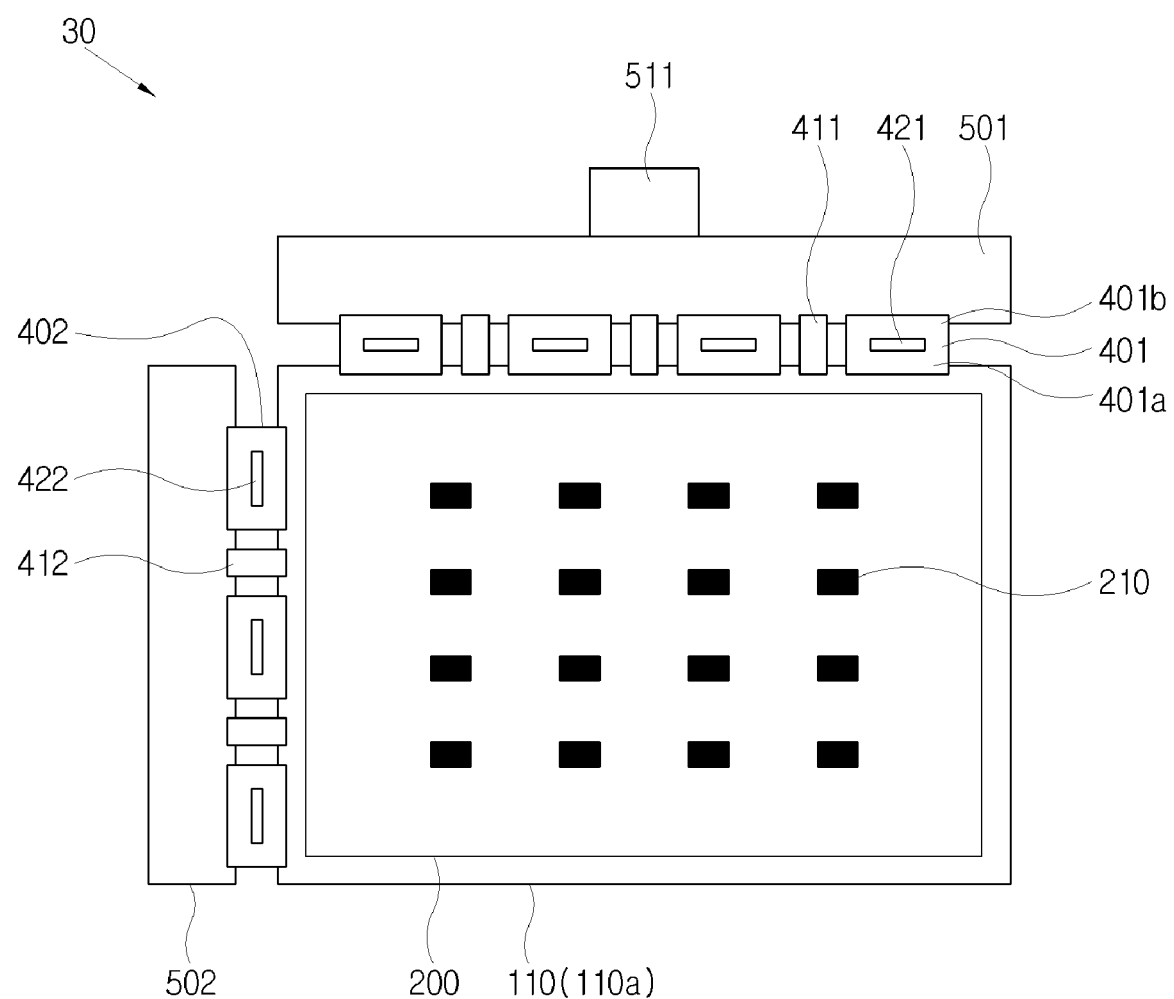
FIG. 5 is a front view of a panel assembly of the display device according to the first exemplary embodiment of the present invention.

FIG. 5 is a front view of the panel assembly of the display device according to the first exemplary embodiment of the present invention.

Referring to FIG. 5, the panel assembly 30 includes the insulating substrate 110, a display element (shown in FIG. 6) formed on the insulating substrate 110, and an encapsulation substrate 200 arranged on the insulating substrate 110 to cover the display element. A moisture absorbent layer 210 is arranged on an internal portion of the encapsulation substrate 200 to protect the display element from impurities such as moisture.

Hereinafter, elements of the insulating substrate 110 shown in FIG. 5, such as "an upper part," "a lower part," "a left part," and "a right part," are described with reference to the front view of the panel assembly shown in FIG. 5.

The insulating substrate 110 may be formed of an insulating material such as glass, quartz, ceramic, or plastic. The insulating substrate 110 includes a second surface 110a on which the display element is formed, and a first surface 10b facing the second surface 110a.

The first flexible member 401 and the second flexible member 411 are connected to an upper part of the second surface 10a of the insulating substrate 110. More specifically, a first end 401a of the first flexible member 401 and a first end of the second flexible member 411 are connected to the second surface 110a. A second end 401b of the first flexible member 401 and a second end of the second flexible member 411 are connected to the first circuit substrate 501. The first flexible member 401 may transmit a data signal to the display element. The second flexible member 411 may transmit a driving voltage to the display element.

The first flexible member 401 and the second flexible member 411 each may be connected to the insulating substrate 110 and the first circuit substrate 501 using an anisotropic conductive film (not shown).

A first driving chip 421 is connected to the first flexible member 401. The first flexible member 401 is flexible and thus may be easily deformed. A wiring (not shown) may be arranged on the first flexible member 401 to connect the first driving chip 421 to the display element and to the first circuit substrate 501.

The first circuit substrate 501 receives power and a driving signal, and changes them to be supplied to the display element as at least a driving voltage and a data signal. Electric elements (not shown) may be connected to the first circuit substrate 501 to change the input power and the driving signal. A first end of the first circuit substrate 501 is connected to the first flexible member 401 and the second flexible member 411. A second end of the first circuit substrate 501 is connected to the external connector 511.

The third flexible member 402 and the fourth flexible member 412 are connected to a left part of the second surface 110a. More specifically, a first end of the third flexible member 402 and a first end of the fourth flexible member 412 are connected to the second surface 110a. A second end of the third flexible member 402 and a second end of the fourth flexible member 412 are connected to the second circuit substrate 502. The third flexible member 402 may transmit the gate signal to the display element. The fourth flexible member 412 may transmit a common voltage to the display element.

The third flexible member 402 and the fourth flexible member 412 may be connected to the insulating substrate 110 and the second circuit substrate 502 using an anisotropic conductive film (not shown).

A second driving chip 422 is connected to the third flexible member 402. The third flexible member 402 is flexible and thus may be easily deformed. A wiring (not shown) may be arranged on the third flexible member 402 to connect the second driving chip 422 to the display element and to the second circuit substrate 502.

The second circuit substrate 502 receives power and a driving signal, and changes them to be supplied to the display element as at least a common voltage and a gate signal. Electric elements (not shown) may be connected to the second circuit substrate 502 to change the input power and the driving signal.

As described above, the second flexible member 411 transmits the driving voltage and the fourth flexible member 412 transmits the common voltage. Thus, the second flexible member 411 and the fourth flexible member 412 each may be formed of a metal plate without an additional pattern. The metal plate may be a highly conductive material, such as copper.

The lower part of the insulating substrate 110 and the right part of the insulating substrate 110 do not need to be connected to additional elements.

As shown in FIG. 3, FIG. 4, FIG. 5, and FIG. 6, the first flexible member 401, the second flexible member 411, the third flexible member 402, and the fourth flexible member 412 are folded to overlap with the insulating substrate 110 to decrease the size of the display device 1. The first circuit substrate 501, which is connected to the first flexible member 401 and the second flexible member 411, is folded to overlap with the insulating substrate 110. The second circuit substrate 502, which is connected to the third flexible member 402 and the fourth flexible member 412, is folded to overlap with the insulating substrate 110.

Figure 6:
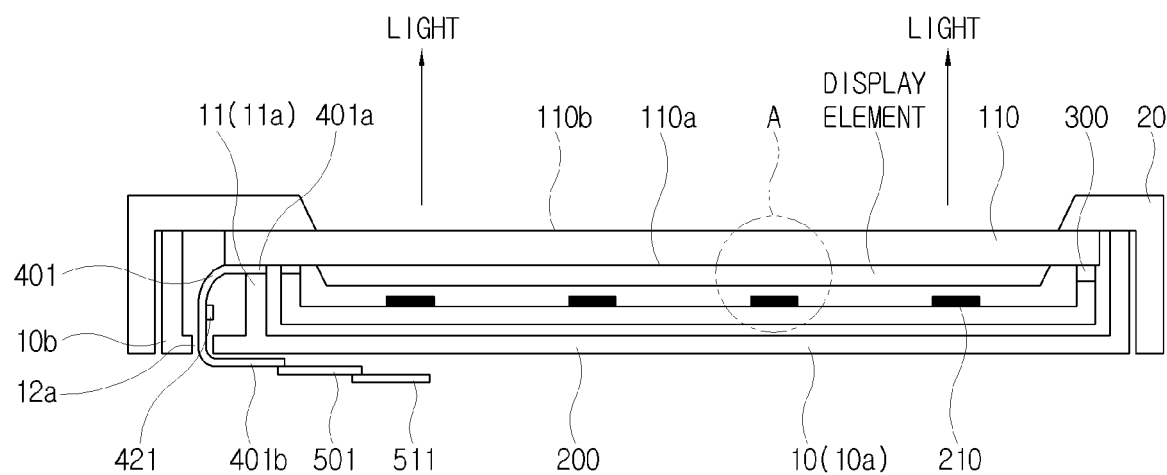
FIG. 6 is a cross-sectional view of the display device according to the first exemplary embodiment of the present invention, taken along line VI-VI in FIG. 3.

FIG. 6 is a cross-sectional view of the display device according to the first exemplary embodiment of the present invention, taken along line VI-VI in FIG. 3.

The bending type of the first flexible member 401, the second flexible member 411, the third flexible member 402, and the fourth flexible member 412, the relations between the first flexible member 401, the second flexible member 411, the third flexible member 402, and the fourth flexible member 412 and the protruding part 11, and between the first flexible member 401, the second flexible member 411, the third flexible member 402, and the fourth flexible member 412 and the through hole 12 will be described in detail with reference to FIG. 6.

As shown in FIG. 6, the first end 401a of the first flexible member 401 is connected to the second surface 10a of the insulating substrate 110. The first flexible member 401 is bent so that the second end 401b faces the first end 401a. That is, the first flexible member 401 is bent in a C-shape.

The first flexible member 401 extends outside the first accommodating member 10 through the first through hole 12a of the first accommodating member 10. The first circuit substrate 501 connected to the second end 401b of the first flexible member 401 is arranged substantially parallel with the insulating substrate 110.

Additionally, the first protruding part 11a of the first accommodating member 10 may contact and press against the first end 401a of the first flexible member 401 to prevent separation of the first end 401a from the second surface 10a of the insulating substrate 110. Because of the pressure applied by the first protruding part 11a, the first flexible member 401 may be stably connected to the insulating substrate 110.

In the first exemplary embodiment of the present invention, the first protruding part 11a directly contacts and presses the first end 401a of the first flexible member 401. In another exemplary embodiment of the present invention, the first protruding part 11a may be arranged close to, but not directly contacting, the first end 401a of the first flexible member 401.

In this case, the first protruding part 11a still may prevent the first flexible member 401 from being separated from the insulating substrate 110.

In the first exemplary embodiment of the present invention, the second flexible member 411 is also pressed by the first protruding part 11a, and the third flexible member 402 and the fourth flexible member 412 are pressed by the second protruding part 11b in a manner substantially similar to that described above.

The encapsulation substrate 200 may be formed of glass or aluminum. A sealant 300 is arranged along a perimeter of the insulating substrate 110, and connects the insulating substrate 110 and the encapsulation substrate 200.

As described above, the first circuit substrate 501 and the second circuit substrate 502 are arranged on the display element, since the display device 1 is a bottom emission type in which light from the display element is emitted toward the insulating substrate 110. Thus, the circuit substrates 501 and 502 are arranged in a direction to which light is not emitted.

Figure 7:
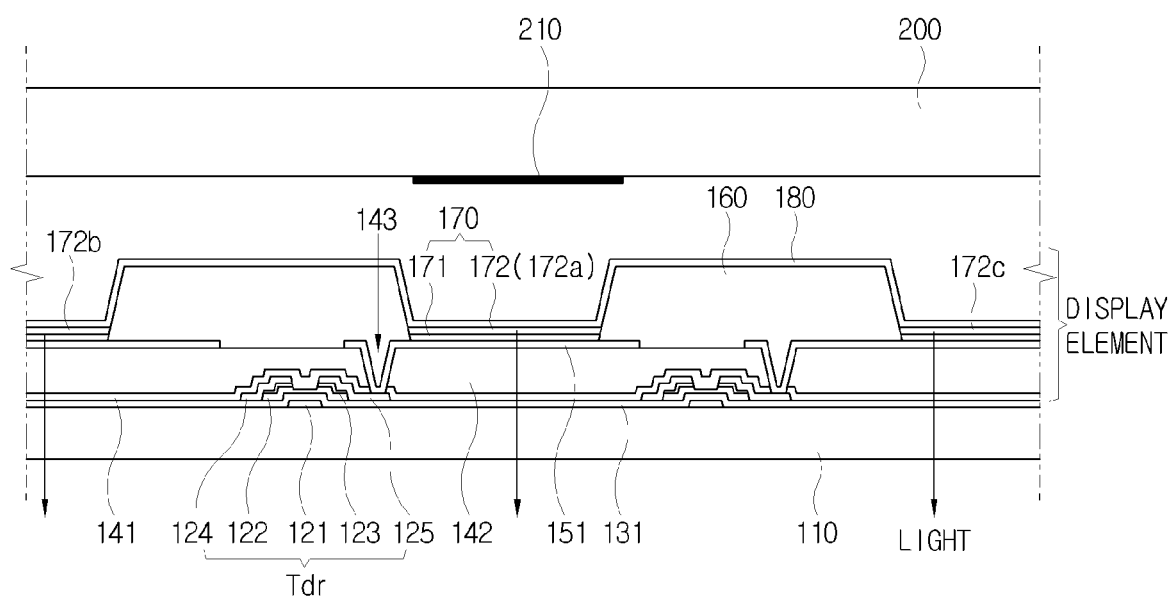
FIG. 7 is a partial enlarged view of region 'A' in FIG. 6.

FIG. 7 is a partial enlarged view of region 'A' in FIG. 6, including the driving TFT Tdr. Referring to FIG. 7, the display element will be described.

A gate electrode 121 is arranged on the insulating substrate 110. A gate insulating layer 131, which may be formed of silicon nitride (SiNx), is arranged on the insulating substrate 110 and on the gate electrode 121. A semiconductor layer 122, which may be formed of amorphous silicon, and an ohmic contact layer 123, which may be formed of n+hydrogenated amorphous silicon highly doped with an n-type dopant, are sequentially arranged on the gate insulating layer 131 in a region corresponding to the gate electrode 121. The ohmic contact layer 123 includes two regions that expose a portion of the semiconductor layer 122 corresponding to the gate electrode 121.

A source electrode 124 is arranged on a first region of the ohmic contact layer 123 and the gate insulating layer 131, and a drain electrode 125 is arranged on a second region of the ohmic contact layer 123 and the gate insulating layer 131. A passivation layer 141 is arranged on the source electrode 124, the drain electrode 125, and the semiconductor layer 122 exposed between the source electrode 124 and the drain electrode 125. The passivation layer 141 may be formed of silicon nitride (SiNx).

A flat layer 142, which may be formed of an organic material, is arranged on the passivation layer 141. The flat layer 142 may be formed of one of benzocyclobutene (BCB), olefin, acrylic resin, polyimide, Teflon, cytop and perfluorocyclobutane (FCB).

A contact hole 143 is formed in the flat layer 142 and the passivation layer 141 to expose the drain electrode 125.

A pixel electrode 151 is arranged on the flat layer 142. The pixel electrode 151 supplies holes to a light-emitting layer 172. The pixel electrode 151 may be formed of a transparent conductive material, such as indium tin oxide (ITO) or indium zinc oxide (IZO), and may be formed using a sputtering method. The pixel electrode 151 may be patterned as a rectangle.

A wall 160 is arranged between adjacent pixel electrodes 151. The wall 160 divides adjacent pixel electrodes 151 and defines a pixel region. The wall 160 also prevents the source electrode 124 and the drain electrode 125 from being short-circuited with the common electrode 180. The wall 160 may be formed of a photosensitive material such as acrylic resin, or polyimide resin having heat resistance and solvent resistance.

An organic layer 170 is arranged on the pixel electrode 151 in a pixel region. The organic layer 170 includes a hole injecting layer 171 and a light-emitting layer 172. Generally, the organic layer 170 may be formed of a polymer or a monomer. Further, the organic layer 170 may be formed using a heat vaporization method.

The hole injecting layer 171 may be formed of a polythiopene derivative such as poly(3,4-ethylenedioxy thiophene) (PEDOT) and polystyrene sulfonic acid (PSS).

The light-emitting layer 172 may include a red light-emitting layer 172a that emits a red light, a green light-emitting layer 172b that emits a green light, or a blue light-emitting layer 172c that emits a blue light. Alternatively, the light-emitting layer 172 may emit a white light, and a color filter (not shown) may be arranged between the insulating substrate 110 and the light-emitting layer 172.

The light-emitting layer 172 may be formed of a poly fluorene derivative, a (poly)paraphenylenevinylene derivative, a polyphenylene derivative, polyvinylcarbazole, and poly thiophene. Further, these polymer materials can be doped with a perylene pigment, a rothermine pigment, rubrene, perylene, 9,10-diphenylanthracene, tetraphenylbutadiene, Nile red, coumarine 6, or Quinacridone, for example.

A hole transmitted from the pixel electrode 151 combines with an electron from a common electrode 180 on the light-emitting layer 172 to create an exciton and release a photon, thereby emitting light toward the insulating substrate 110 in a bottom emission type display device 1.

The common electrode 180 is arranged on the wall 160 and on the light-emitting layer 172. The common electrode 180 supplies electrons to the light-emitting layer 172. The common electrode 180 may be formed of a reflective metal such as aluminum or silver.

Figure 8:
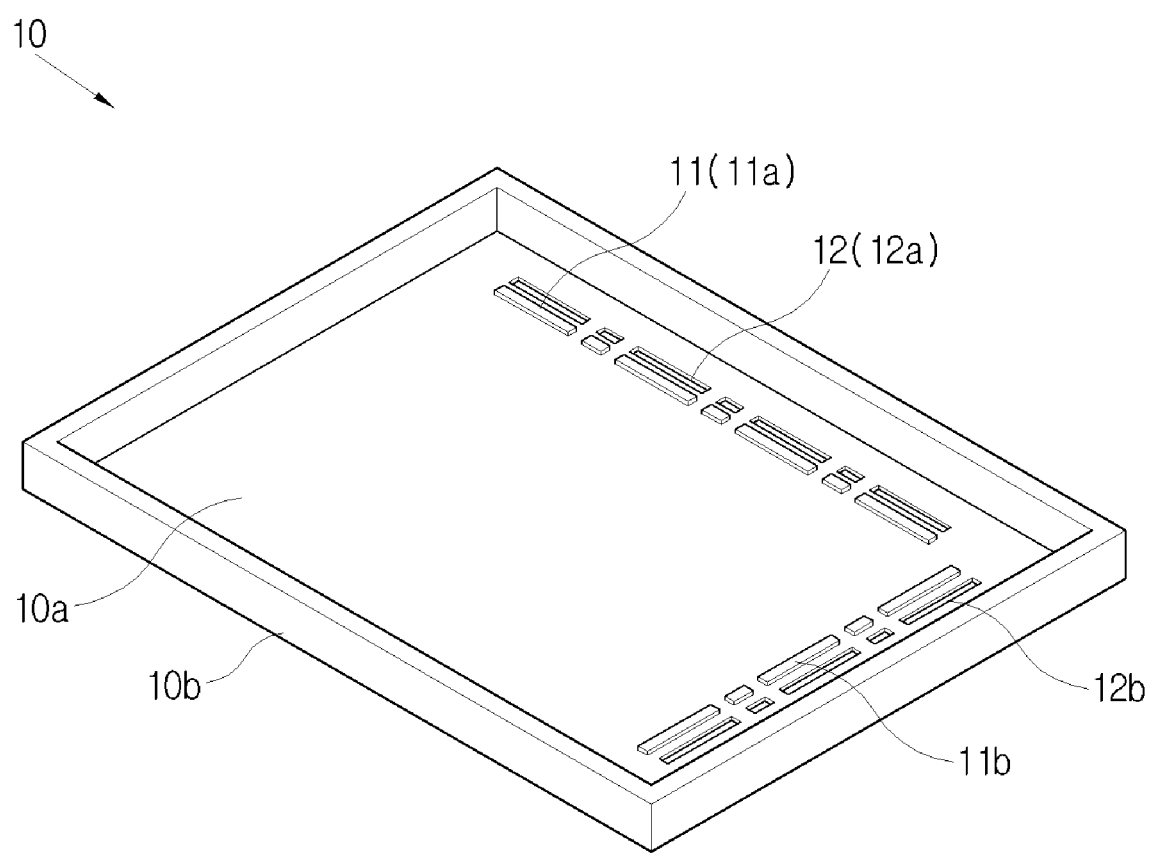
FIG. 8 is a perspective view of a first accommodating member of a display device according to a second exemplary embodiment of the present invention.

FIG. 8 is a perspective view of a first accommodating member of a display device according to a second exemplary embodiment of the present invention. Referring to FIG. 8, a display device according to the second exemplary embodiment of the present invention will be described, with a focus on the differences between the second exemplary embodiment of the present invention and the first exemplary embodiment of the present invention.

As shown in FIG. 8, first protruding parts 11a are separated from each other to individually correspond to a first flexible member 401 or a second flexible member 411. First through holes 12a are also separated from each other to individually correspond to a first flexible member 401 or a second flexible member 411. Because the combined size of the first through holes 12a according to the second exemplary embodiment of the present invention is smaller than the combined size of the first through hole 12a according to the first exemplary embodiment of the present invention, dirt and other foreign particles may be less likely to pass through the first through holes 12a.

Similarly, second protruding parts 11b are separated from each other to individually correspond to a third flexible member 402 or a fourth flexible member 412. Second through holes 12b are also separated from each other to individually correspond to a third flexible member 402 or a fourth flexible member 412. Because the combined size of the second through holes 12b according to the second exemplary embodiment of the present invention is smaller than the combined size of the second through hole 12b according to the first exemplary embodiment of the present invention, dirt and other foreign particles may be less likely to pass through the second through holes 12b.

Figure 9:
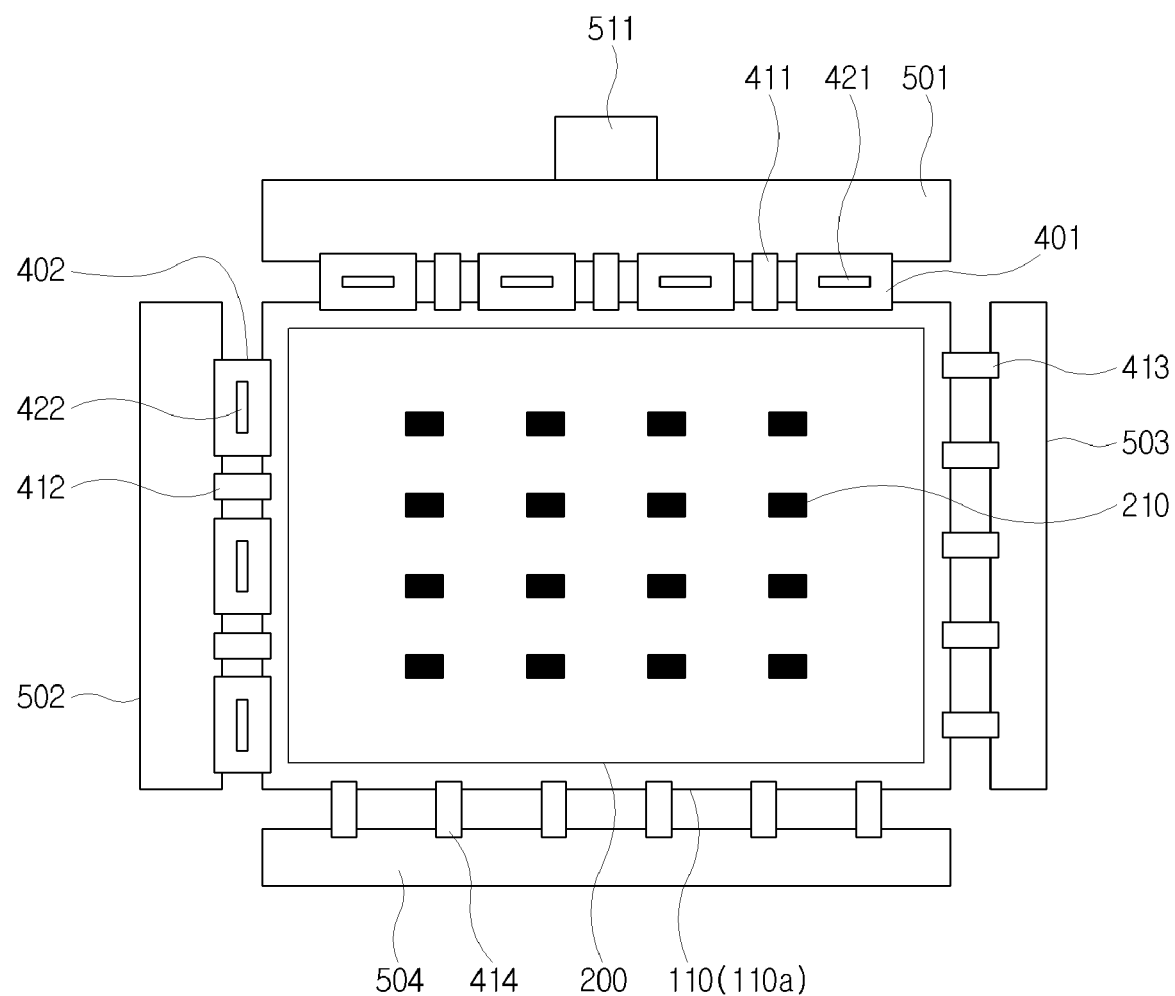
FIG. 9 is a front view of a panel assembly of a display device according to a third exemplary embodiment of the present invention.
Figure 10:
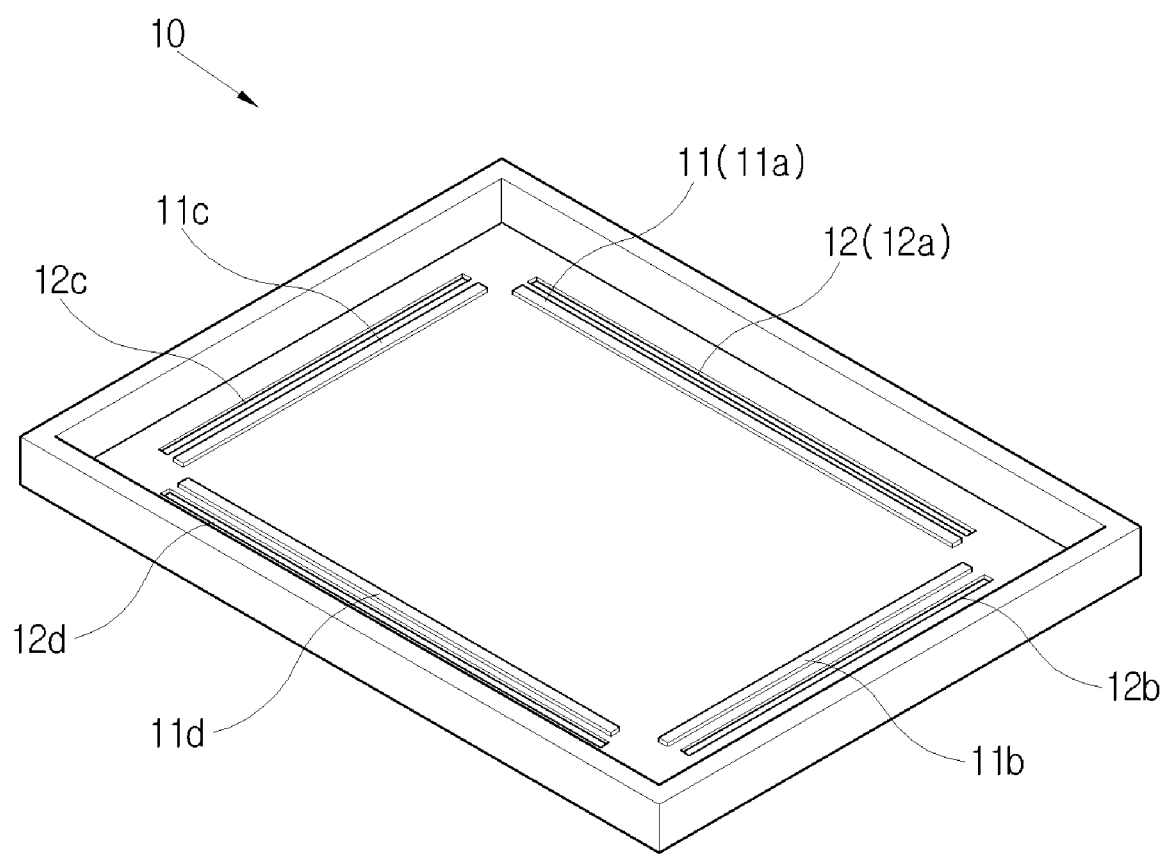
FIG. 10 is a perspective view of a first accommodating member of the display device according to the third exemplary embodiment of the present invention.

FIG. 9 is a front view of a panel assembly of a display device according to a third exemplary embodiment of the present invention. FIG. 10 is a perspective view of a first accommodating member of the display device according to the third exemplary embodiment of the present invention.

Referring to FIG. 9 and FIG. 10, a display device according to the third exemplary embodiment of the present invention will be described with a focus on the differences between the third exemplary embodiment of the present invention and the first exemplary embodiment of the present invention.

As shown in FIG. 9, a fifth flexible member 413 and a third circuit substrate 503 are connected to a right part of an insulating substrate 110. The third circuit substrate 503 may receive a common voltage, and may transmit the common voltage to a display element through the fifth flexible member 413. The display element may maintain a common voltage more uniformly when the display device 1 includes the fifth flexible member 413 and the third circuit substrate 503.

A sixth flexible member 414 and a fourth circuit substrate 504 are connected to a lower part of the insulating substrate 110. The fourth circuit substrate 504 may receive a driving voltage, and may transmit the driving voltage to the display element through the sixth flexible member 414. The display element may maintain a driving voltage more uniformly when the display device 1 includes the sixth flexible member 414 and the fourth circuit substrate 504.

The fifth flexible member 413 and the sixth flexible member 414 may have a substantially similar configuration as the second flexible member 411 and the fourth flexible member 412.

As shown in FIG. 10, a protruding part 11 of a first accommodating member 10 further includes a third protruding part 11c arranged on a part of the first accommodating member 10 corresponding to the fifth flexible member 413 and the third circuit substrate 503, and a fourth protruding part 11d arranged on a lower part of the first accommodating member 10 corresponding to the sixth flexible member 414 and the fourth circuit substrate 504. The third protruding part 11c may contact and press against the fifth flexible member 413. The fourth protruding part 11d may contact and press against the sixth flexible member 414.

A through hole 12 of the first accommodating member 10 further includes a third through hole 12c arranged on a part of the first accommodating member 10 corresponding to the fifth flexible member 413 and the third circuit substrate 503, and a fourth through hole 12d arranged on a lower part of the first accommodating member 10 corresponding to the sixth flexible member 414 and the fourth circuit substrate 504. The fifth flexible member 413 extends outside of the first accommodating member 10 through the third through hole 12c. The sixth flexible member 414 extends outside of the first accommodating member 10 through the fourth through hole 12d.

Figure 11:
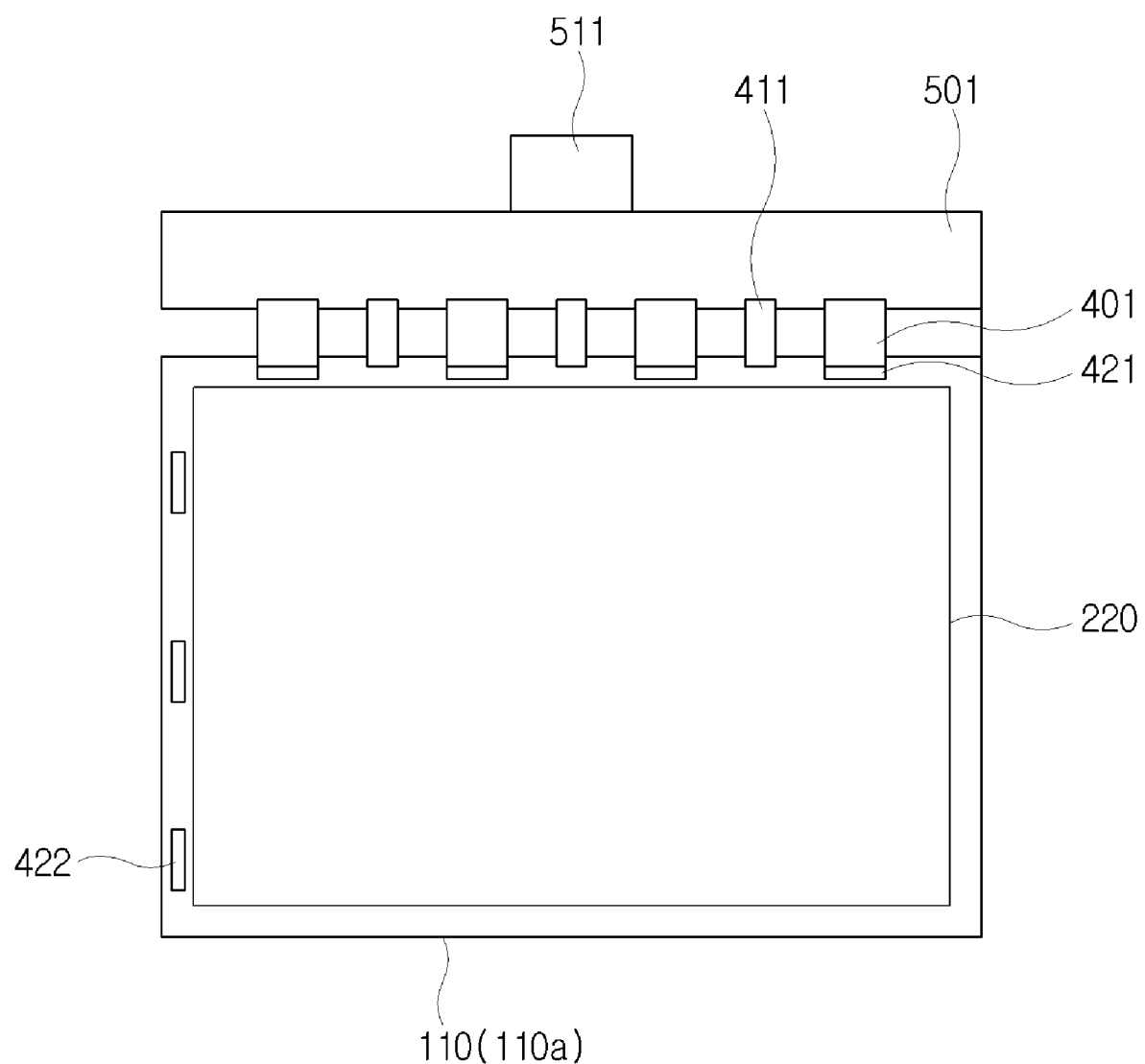
FIG. 11 is a front view of a panel assembly of a display device according to a fourth exemplary embodiment of the present invention.
Figure 12:
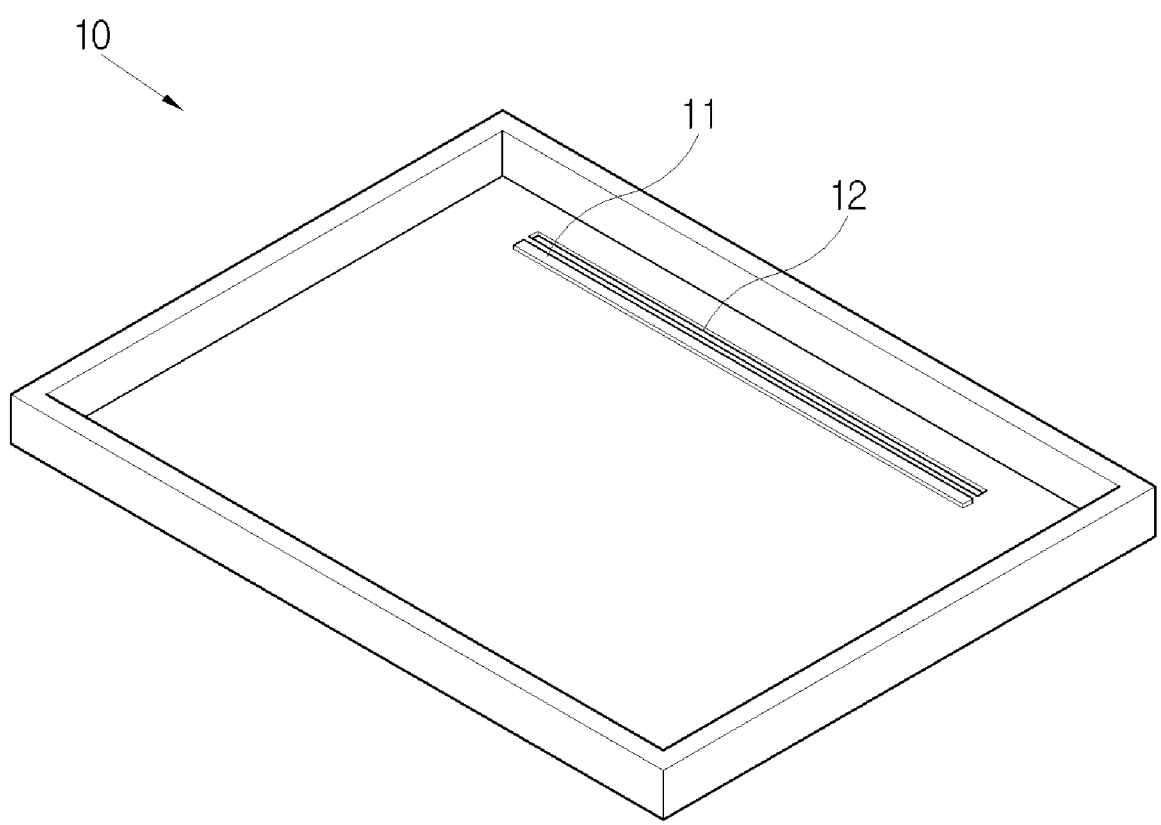
FIG. 12 is a perspective view of a first accommodating member of the display device according to the fourth exemplary embodiment of the present invention.
Figure 13:
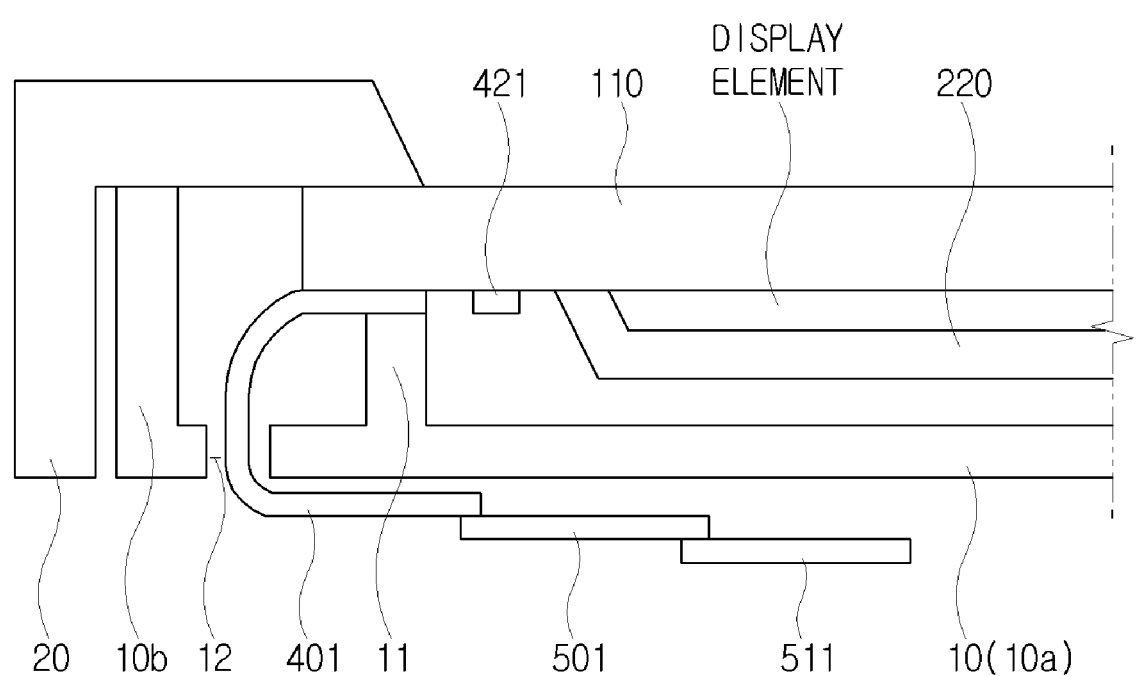
FIG. 13 is a cross-sectional view of the display device according to the fourth exemplary embodiment of the present invention, taken along a cross-section similar to line VI-VI in FIG. 3.

FIG. 11 is a front view of a panel assembly of a display device according to a fourth exemplary embodiment of the present invention. FIG. 12 is a perspective view of a first accommodating member of the display device according to the fourth exemplary embodiment of the present invention. FIG. 13 is a cross-sectional view of the display device according to the fourth exemplary embodiment of the present invention, taken along a cross-section similar to line VI-VI in FIG. 3.

Referring to FIG. 11, FIG. 12, and FIG. 13, a display device according to a fourth exemplary embodiment of the present invention will be described with a focus on the differences between the fourth exemplary embodiment of the present invention and the first exemplary embodiment of the present invention.

As shown in FIG. 11, first driving chip 421 and second driving chip 422 are arranged on the second surface 110a of the insulating substrate 110, unlike in the first embodiment.

No circuit substrate is included to supply a gate signal. A wiring (not shown) is arranged on the second surface 110a to transmit a gate signal and a common voltage from the first circuit substrate 501 to the second driving chip 422. A first flexible member 401 and a second flexible member 411 are arranged only on the upper part of the insulating substrate 110 of a panel assembly 30.

As shown in FIG. 12, a protruding part 11 and a through hole 12 of a first accommodating member 10 are formed on an upper part of the first accommodating member 10 in a transverse direction, since the first flexible member 401 and the second flexible member 411 are arranged only on the upper part of the insulating substrate 110 of a panel assembly 30.

As shown in FIG. 13, the display element and the first driving chip 421 are covered by an encapsulation layer 220. The encapsulation layer 220 prevents impurities such as moisture or oxygen from being introduced to the display element. The encapsulation layer 220 may be formed of an inorganic layer and/or an organic layer.

Additionally, the protruding part 11 of the first accommodating member 10 contacts and presses against the flexible member 401, thereby providing the stable assembly as described above with respect to the first exemplary embodiment of the present invention.

Thus, as described above, the present invention provides a display device in which a flexible member is stably connected to an insulating substrate.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
an insulating substrate comprising a first surface and a second surface opposing the first surface;
a display element arranged on the first surface, the display element comprising an organic light-emitting layer arranged between a first electrode and a second electrode;
a flexible member connected to the display element, the flexible member comprising a first end connected to the first surface, and a second end facing the first end and the first surface; and
a first accommodating member, the first accommodating member comprising a lower surface arranged substantially parallel with the insulating substrate, a lateral surface extending from the lower surface, and a protruding part extending from the lower surface and supporting the first end of the flexible member.

2. The display device of claim 1, wherein the protruding part contacts the first end.

3. The display device of claim 1, further comprising:
an encapsulation member covering the display element, wherein a portion of the encapsulation member is arranged between the flexible member and the display element.

4. The display device of claim 1, wherein the flexible member is arranged in a C-shape.

5. The display device of claim 4, further comprising:
a circuit substrate connected to the second end of the flexible member, and arranged substantially parallel with the insulating substrate.

6. The display device of claim 4, further comprising:
a chip arranged on the insulating substrate and connected to the flexible member.

7. The display device of claim 4, further comprising:
a chip arranged on the flexible member.

8. The display device of claim 4, wherein the flexible member comprises a metal plate.

9. The display device of claim 8, wherein a driving voltage or a common voltage is transmitted to the display element through the flexible member.

10. The display device of claim 4, further comprising:
a second accommodating member connected to the first accommodating member and comprising an opening part exposing the second surface of the insulating substrate.

11. The display device of claim 4, wherein the second electrode comprises a reflective metal.

12. The display device of claim 11, wherein the first accommodating member comprises a through hole, the flexible member extends through the through hole, and the second end is positioned outside the first accommodating member.

13. The display device of claim 12, wherein the flexible member is one of a plurality of flexible members, the through hole is one of a plurality of through holes arranged in the first accommodating member, and each through hole corresponds to one flexible member.

14. The display device of claim 4, wherein the first accommodating member is formed integrally with the protruding part.

15. The display device of claim 14, wherein the first accommodating member and the protruding part comprise a plastic material.

16. A display device, comprising:
an insulating substrate;
a display element arranged on a surface of the insulating substrate and comprising an organic light-emitting layer;
a flexible member comprising a first end connected to a lateral side of the insulating substrate;
a circuit substrate connected to a second end of the flexible member; and
an accommodating member accommodating the insulating substrate,
wherein the flexible member is bent to allow the circuit substrate to overlap with the display element, and the accommodating member comprises a protruding member to contact the first end.

17. The display device of claim 16, further comprising:
an encapsulation member covering the display element, wherein a portion of the encapsulation member is arranged between the circuit substrate and the display element.

18. The display device of claim 16, wherein the flexible member is arranged in a C-shape.

19. The display device of claim 16, wherein the accommodating member comprises a through hole through which the flexible member extends, and the accommodating member is arranged between the circuit substrate and the display element.

20. The display device of claim 19, wherein the flexible member is one of a plurality of flexible members, the through hole is one of a plurality of through holes arranged in the accommodating member, and each through hole corresponds to a flexible member.

21. The display device of claim 19, wherein the first accommodating member is formed integrally with the protruding part, and the first accommodating member and the protruding part comprise a plastic material.

* * * * *